United States Patent
Swanson et al.

(10) Patent No.: US 8,446,195 B2
(45) Date of Patent: May 21, 2013

(54) STROBE SIGNAL MANAGEMENT TO CLOCK DATA INTO A SYSTEM

(75) Inventors: Richard W. Swanson, San Jose, CA (US); Tao Pi, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 311 days.

(21) Appl. No.: 12/794,530

(22) Filed: Jun. 4, 2010

(65) Prior Publication Data

US 2011/0298511 A1    Dec. 8, 2011

(51) Int. Cl.
*H03L 7/06* (2006.01)

(52) U.S. Cl.
USPC .......................................... 327/158

(58) Field of Classification Search
None
See application file for complete search history.

(56) References Cited

U.S. PATENT DOCUMENTS

| | | | |
|---|---|---|---|
| 7,020,728 B1 | 3/2006 | Jones et al. | |
| 7,167,023 B1 | 1/2007 | Pan et al. | |
| 7,171,321 B2 * | 1/2007 | Best | 702/106 |
| 2009/0238017 A1 * | 9/2009 | Wakasa | 365/194 |
| 2011/0299347 A1 | 12/2011 | Swanson et al. | |
| 2011/0299351 A1 | 12/2011 | Schultz | |
| 2011/0302356 A1 | 12/2011 | Helton | |

* cited by examiner

*Primary Examiner* — Daniel Rojas
(74) *Attorney, Agent, or Firm* — Kevin T. Cuenot (57) ABSTRACT

A method of communicating with a source synchronous device can include determining an expected number of pulses of a strobe signal to be received in response to a first read request directed to the source synchronous device and receiving the strobe signal from the source synchronous device. Pulses in the strobe signal can be counted. Responsive to detecting a last pulse of the expected number of pulses of the strobe signal, the strobe signal can be replaced with a reference signal that is phase and frequency aligned with the strobe signal.

12 Claims, 4 Drawing Sheets

STROBE SIGNAL MANAGEMENT TO CLOCK DATA INTO A SYSTEM

FIELD OF THE INVENTION

One or more embodiments disclosed within this specification relate to integrated circuits (ICs). More particularly, one or more embodiments relate to management of a strobe signal to clock data into a system.

BACKGROUND

A device that utilizes a source synchronous interface provides a reference signal along with data sent from the device. The reference signal is generally referred to as a strobe signal or a data strobe (DQS) signal. One example of a source synchronous device (source) is a synchronous dynamic random access memory (SDRAM) device. The strobe signal sent from the source is used by the device (target) that is coupled to, and communicating with, the source.

The target device must synchronize with the strobe signal in order to capture data from the source and interpret the data correctly. Since sources can operate over a wide range of frequencies, a target must be able to synchronize with data strobe signals over a wide range of frequencies. Typically, the target utilizes a delay line to synchronize with the strobe signal. Strobe signals having lower frequencies have larger periods and, thus, require delay lines capable of providing a larger amount of delay to achieve synchronization as compared to higher frequencies. Delay lines, however, can consume a large portion of the area of an integrated circuit, particularly when used to synchronize with lower frequency strobe signals.

In some cases, the strobe signal accompanying the data provided by the source is inadequate for use by the target. For example, the strobe signal provided by the source generally stops providing pulses when the data stops. In some cases, the target is not finished propagating the received data to the desired destination within the target when the pulses on the strobe signal terminate.

SUMMARY

One or more embodiments disclosed within this specification relate to integrated circuits (ICs) and, more particularly, to management of a strobe signal to clock data into a system. One embodiment of the present invention can include a method of communicating with a source synchronous device. The method can include determining an expected number of pulses of a strobe signal to be received in response to a first read request directed to the source synchronous device and receiving the strobe signal from the source synchronous device. Pulses in the strobe signal can be counted. Responsive to detecting a last pulse of the expected number of pulses of the strobe signal, the strobe signal can be replaced with a reference signal that is phase and frequency aligned with the strobe signal.

Another embodiment of the present invention can include a system for communicating with a source synchronous device. The system can include a pulse controller configured to count pulses from the source synchronous device received in a strobe signal responsive to a first read request. The pulse controller can be configured to detect a last pulse of a predetermined number of expected pulses. The system also can include a multiplexer coupled to the pulse controller and configured to selectively pass a strobe signal or a reference signal responsive to an instruction received from the pulse controller. The reference signal can be phase and frequency aligned with the strobe signal. Responsive to the pulse controller detecting the last pulse, the pulse controller can be configured to instruct the multiplexer to pass the reference signal in lieu of the strobe signal.

Another embodiment of the present invention can include a system for communicating with a source synchronous device. The system can include a delay line configured to apply an adjustable amount of delay to a reference signal and at least one frequency divider coupled to the delay line. The frequency divider can be configured to generate a first frequency divided signal and a second frequency divided signal from a version of the reference signal output from the delay line. The first and the second frequency divided signals can have a same frequency and a different phase. The system also can include a phase detector configured to determine a phase relationship between a strobe signal and at least one of the first frequency divided signal or the second frequency divided signal. An output selector can be coupled to the at least one frequency divider. The output selector can be configured to pass the first frequency divided signal or the second frequency divided signal according to a counter that indicates adjustments in the amount of delay applied by the delay line. The delay line can adjust an amount of delay applied to the reference signal responsive to the phase relationship determined by the phase detector. Responsive to the delay line rolling over, the amount of delay applied to the reference signal can be adjusted and the second frequency divided signal can be output.

DETAILED DESCRIPTION OF THE DRAWINGS

While the specification concludes with claims defining the features of one or more embodiments of the invention that are regarded as novel, it is believed that the one or more embodiments of the invention will be better understood from a consideration of the description in conjunction with the drawings. As required, one or more detailed embodiments of the present invention are disclosed herein; however, it is to be understood that the one or more embodiments disclosed are merely exemplary of the inventive arrangements, which can be embodied in various forms. Therefore, specific structural and functional details disclosed within this specification are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting, but rather to provide an understandable description of one or more embodiments of the invention.

One or more embodiments disclosed within this specification relate to integrated circuits (ICs) and, more particularly, to management of a strobe signal to clock data into a system such as an IC. In accordance with the inventive arrangements disclosed within this specification, a reference signal can be synchronized with a strobe signal received from a source synchronous device sending data. When the pulses on the strobe signal terminate with the data, the reference signal can be propagated to one or more subsystems in lieu of the strobe signal. Providing the reference signal in lieu of the strobe signal allows the system to complete the clocking of received data into the destination subsystem(s). The reference signal effectively replaces the strobe signal to complete the capture and propagation of data received from the source synchronous device.

To utilize the reference signal, the reference signal must be both phase and frequency aligned with the strobe signal. In one or more embodiments, a delay line can be used in combination with one or more frequency divider circuits. A high frequency reference signal can be used to generate a lower frequency reference signal that is phase and frequency aligned with the strobe signal. For example, the high frequency reference signal can have a frequency that is a given multiple higher than the strobe signal and, thus, the lower frequency reference signal.

The delay line can be configured to provide a maximum amount of delay that is approximately equal to the period of the high frequency reference signal. The frequency divider(s) can be configured to provide several different frequency divided signals, where each signal has a different phase. The phase difference between each frequency divided signal can be approximately equal to the period of the high frequency reference signal. While delays of up to a period of the high frequency reference signal can be achieved via the delay line, delays in excess of the period of the high frequency reference signal can be achieved by selecting a different frequency divided signal having a desired phase variance to output in combination with adjusting the amount of delay provided by the delay line. Using a delay line in combination with one or more frequency dividers requires less area than including the number and size of delay lines needed to operate over the same frequency range.

Figure 1:
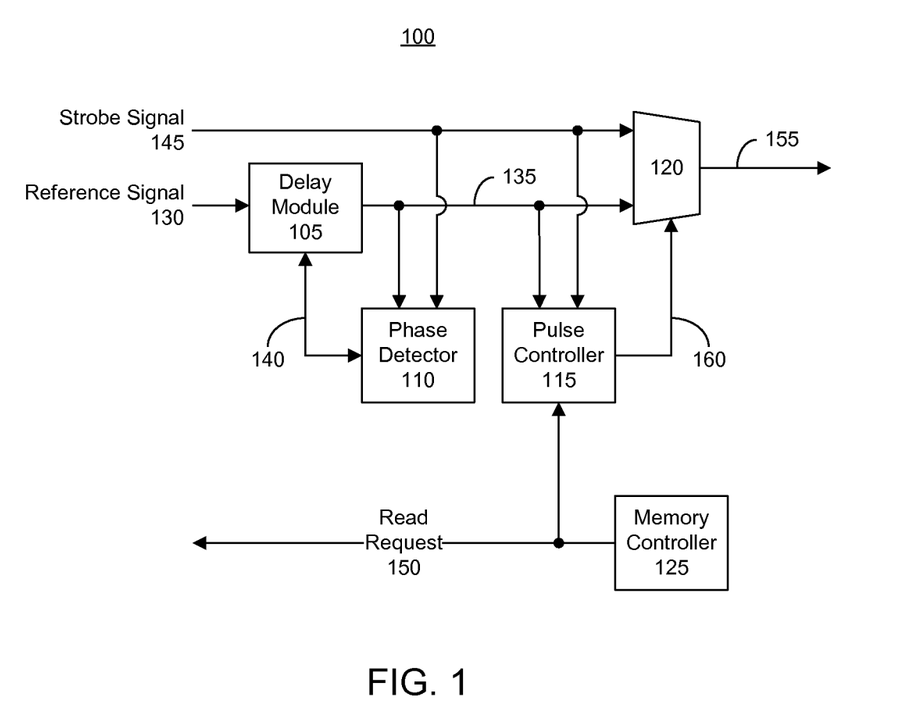
FIG. 1 is a first block diagram illustrating a system for managing a strobe signal in accordance with one embodiment of the present invention.

FIG. 1 is a first block diagram illustrating a system 100 for managing a strobe signal in accordance with one embodiment of the present invention. System 100 can be implemented within an IC, e.g., a target, to facilitate communication with a source synchronous device (source) such as a memory. For example, a source can include any of a variety of synchronous dynamic random access memory (SDRAM) devices. It should be appreciated, however, that while a memory is used within this specification for purposes of illustration, the one or more embodiments disclosed herein are not intended to be limited for use solely with a memory.

In one or more embodiments, system 100 can be implemented within a programmable IC. Programmable ICs are a well-known type of IC that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAMs), multipliers, digital signal processing blocks (DSPs), processors, clock managers, delay lock loops (DLLs), and so forth.

Each programmable tile typically includes both programmable interconnect and programmable logic circuitry. The programmable interconnect circuitry typically includes a large number of interconnect lines of varying lengths interconnected by programmable interconnect points (PIPs). The programmable logic circuitry implements the logic of a user design using programmable elements that can include, for example, function generators, registers, arithmetic logic, and so forth.

The programmable interconnect and programmable logic circuits are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of programmable IC is the complex programmable logic device, or CPLD. A CPLD includes two or more "function blocks" connected together and to input/output (I/O) resources by an interconnect switch matrix. Each function block of the CPLD includes a two-level AND/OR structure similar to those used in programmable logic arrays (PLAs) and programmable array logic (PAL) devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable ICs, the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell. Other programmable ICs are programmed by applying a processing layer, such as a metal layer, that programmably interconnects the various elements on the device. These programmable ICs are known as mask programmable devices.

Programmable ICs can also be implemented in other ways, e.g., using fuse or antifuse technology. The phrase "programmable IC" can include, but is not limited to these devices and further can encompass devices that are only partially programmable. For example, one type of programmable IC includes a combination of hard-coded transistor logic and a programmable switch fabric that programmably interconnects the hard-coded transistor logic.

The one or more embodiments disclosed herein are not intended to be limited to implementation or use within programmable ICs. Rather, system 100 can be disposed within any of a variety of different IC types. For example, the IC within which system 100 can be implemented can be a processor having an embedded memory controller, an application specific IC, a mixed signal IC, or other type of non-programmable IC.

As shown, system 100 can include a delay module 105, a phase detector 110, a pulse controller 115, and a multiplexer 120. A memory controller 125 also can be included. Delay module 105 can receive a reference signal 130, e.g., a first reference signal, and can apply a selected amount of delay to reference signal 130 to generate and/or output a delayed version of reference signal 130 denoted as signal 135. Signal 135 also can be referred to as a second reference signal. The amount of delay applied to reference signal 130 by delay module 105 can be specified and/or determined by phase detector 110 via control signal 140.

Within this specification, the same reference characters are used to refer to terminals, signal lines, wires, and their corresponding signals. In this regard, the terms "signal," "wire," "connection," "terminal," and "pin" may be used interchangeably, from time-to-time, within the this specification. It also should be appreciated that the terms "signal," "wire,"

or the like can represent one or more signals, e.g., the conveyance of a single bit through a single wire or the conveyance of multiple parallel bits through multiple parallel wires. Further, each wire or signal may represent bi-directional communication between two, or more, components connected by a signal or wire as the case may be.

Phase detector 110 can receive signal 135 and strobe signal 145 as inputs. Phase detector 110 can compare signal 135 with strobe signal 145 and measure the phase difference between the two signals. When phase detector 110 detects an edge of reference signal 135 occurring prior to a like edge of strobe signal 145, e.g., where "like" refers to both edges being rising or falling, phase detector 110 can instruct delay module 105 to increment an amount of delay applied to reference signal 135. When phase detector 110 detects an edge of reference signal 135 occurring after a like edge of strobe signal 145, phase detector 110 can instruct delay module 105 to decrement the amount of delay applied to reference signal 135.

When aligned, or substantially aligned, delay module 105 can, for example, toggle back and forth between incrementing the amount of delay and decrementing the amount of delay applied to signal 135. Thus, when the amount of delay stays relatively constant, e.g., continually cycling back and forth between two different amounts of delay, phase detector 110 can determine that signal 135 is phase and frequency aligned with strobe signal 145.

In one or more embodiments, reference signal 130 can have approximately a same frequency as strobe signal 145. In that case, delay module 105 can perform time shifting by adding or removing delay, for example, using a delay line. In one or more other embodiments to be described herein in greater detail, reference signal 130 can be set to a frequency that is higher than strobe signal 145. For example, reference signal 130 can have a frequency that is a multiple, e.g., two, four, or the like, times the frequency of strobe signal 145.

When reference signal 130 has a frequency that is a multiple of the frequency of strobe signal 145, delay module 105 can be configured to include a delay line and one or more frequency dividers. The delay line can be controlled to provide a variable amount of delay to reference signal 130 as specified by control signal 140. The frequency divider(s) bring the frequency of signal 135 down to that of strobe signal 145. Use of the higher frequency version of reference signal 130 in combination with frequency divider(s) and a delay line allows system 100 to achieve phase alignment with strobe signals over a larger frequency range while keeping the size of the delay line smaller than when using delay lines alone without frequency division.

Pulse controller 115 can include circuitry configured to perform several processing functions relating to strobe signal 145 and memory controller 125. In one aspect, pulse controller 115 can determine whether to pass signal 135 or strobe signal 145 through multiplexer 120 and instruct multiplexer 120 accordingly via control signal 160.

In another aspect, pulse controller 115 can be configured to detect read requests, such as read request 150, issued by memory controller 125 to a source (not shown). Responsive to detecting read request 150, pulse controller 115 can determine various attributes of read request 150 such as the amount of data that is to be returned from the source. Pulse controller 115 further can determine whether read request 150 is part of a plurality of back-to-back read requests. For example, pulse controller 115 can monitor for issuance of subsequent read requests from memory controller 125 that occur within a predetermined period of time following read request 150. When a subsequent read request occurs within the predetermined period of time, the read requests are considered back-to-back.

In operation, memory controller 125 can issue read request 150 to the source, e.g., a memory. Read request 150 specifies the amount of data that is requested. Pulse controller 115 can detect read request 150 and determine the number of pulses expected on strobe signal 145 in response to read request 150 based, at least in part, upon the amount of data requested. For example, consider the case in which the source is a dual data rate (DDR) type of static random access memory (SRAM). In that case, when read request 150 requests 4 bits of data, only two pulses are expected on strobe signal 145 since data is clocked on each edge of the pulses of strobe signal 145. Likewise, when 8 bits of data are requested by read request 150, pulse controller 115 determines that 4 pulses are expected on strobe signal 145.

As noted, when the data received from the source synchronous device stops, the pulses on strobe signal 145 that accompany the data also stop. As noted, in some cases a read request can be part of a plurality of back-to-back read requests. With regard to back-to-back read requests, the pulses on strobe signal 145 are continuous and only terminate with the last portion of data sent from the source in response to the last of the back-to-back read requests. When the pulses on strobe signal 145 stop, additional pulses can be required to clock the received data into additional circuitry of the IC within which system 100 is disposed.

For example, consider the case in which system 100 is disposed within a programmable IC. Additional pulses can be required to propagate any received data into additional circuitry such as the programmable fabric of the programmable IC. The received data from the source can be propagated into a deserializer and into a first-in-first-out (FIFO) type of memory. From the FIFO memory, data can be propagated into the fabric of the programmable IC. Accordingly, additional pulses are needed to clock the received data through both the deserializer and the FIFO memory since the pulses on strobe signal 145 stop with the last bit of data sent from the source synchronous device.

Phase detector 110 can measure the phase difference between signal 135 and strobe signal 145. As noted, signal 135 and strobe signal 145 can be approximately the same frequency. Phase detector 110 can instruct delay module 105 to increment the amount of delay or decrement the amount of delay applied to reference signal 130 until signal 135 is phase aligned with strobe signal 145 as described.

When data is received in response to read request 150, pulse controller 115 can instruct multiplexer 120 to pass strobe signal 145 as signal 155. Thus, initially, strobe signal 145 can be propagated to various subsystems, e.g., deserializer(s), FIFO memories, and the like, to clock data received with strobe signal 145. Pulse controller 115 can count pulses received in response to read request 150. When the expected number of pulses is received, pulse controller 115 instructs multiplexer 120 to pass signal 135 as signal 155 in lieu of strobe signal 145. Accordingly, strobe signal 145 is effectively replaced by signal 135. Thus, while pulses have stopped on strobe signal 145, additional pulses needed to continue propagating data received from the source are provided to the subsystems from signal 135.

In one or more embodiments, pulse controller 115 can be configured to allow a predetermined number of pulses from signal 135 to propagate as signal 155 before instructing multiplexer 120 to again pass strobe signal 145 as signal 155. In one or more other embodiments, pulse controller 115 can instruct multiplexer 120 to pass strobe signal 145 responsive to detecting a further, or subsequent, read request being issued from memory controller 125, e.g., a read request immediately following read request 150.

As noted, when a read request is part of a plurality of back-to-back read requests, further pulses are needed only after the last pulse corresponding to the last of the plurality of back-to-back read requests. Accordingly, pulse controller 115 can determine whether a read request is part of a plurality of back-to-back read requests and, if so, whether that read request is the last of the plurality of back-to-back read requests. The procedure to pass signal 135 in lieu of strobe signal 145 can be initiated when the last pulse is detected by pulse controller 115, e.g., whether a last pulse of an individual read request or a last pulse of a last of a plurality of back-to-back read requests.

In one or more embodiments, system 100 can be disposed within a physical interface of an IC. For example, system 100 can be disposed within an input/output bank of an IC.

Figure 2:
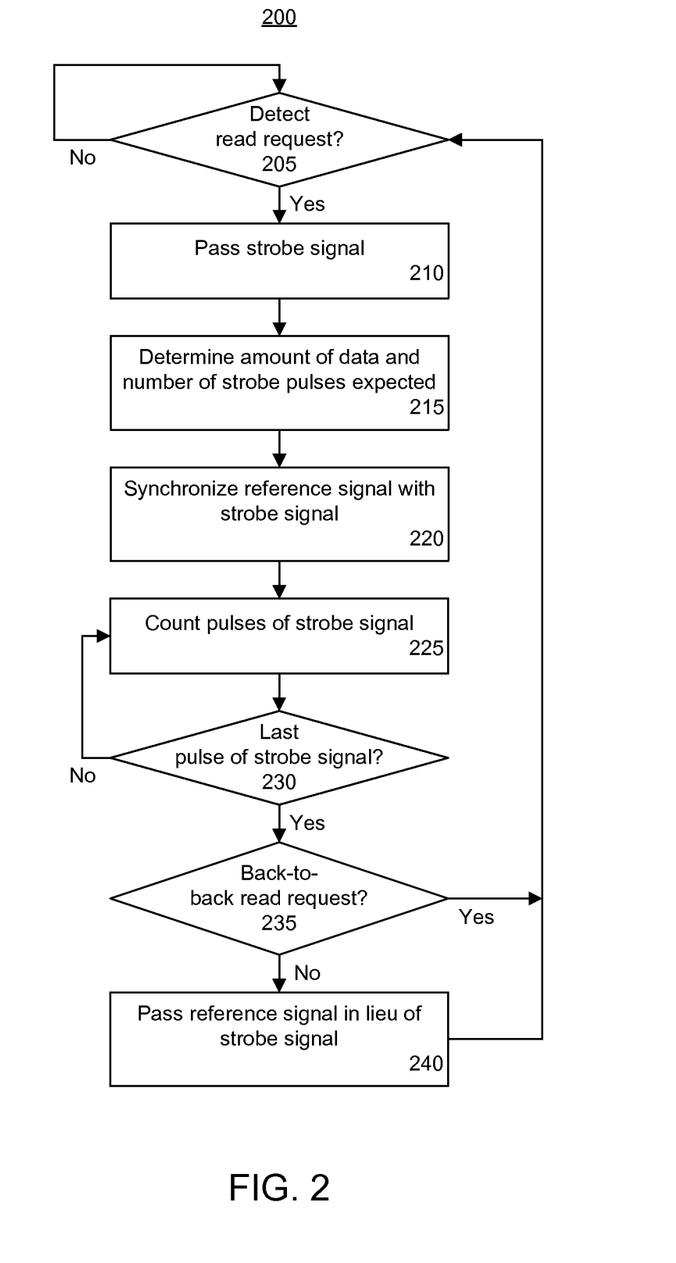
FIG. 2 is a first flow chart illustrating a method of managing a strobe signal in accordance with another embodiment of the present invention.

FIG. 2 is a first flow chart illustrating a method 200 of managing a strobe signal in accordance with another embodiment of the present invention. Method 200 can be performed by a system as described with reference to FIG. 1. Accordingly, in step 205, the system can begin monitoring for read requests and determine whether a read request has been detected. When no read request is detected, method 200 can loop back and continue monitoring for the occurrence of a read request. When a read request is detected, method 200 can continue to step 210.

In step 210, the system can receive the strobe signal from the source and pass the strobe signal through to one or more other subsystems of the IC within which the system is disposed. In step 215, the system can determine the amount of data to be received from the source to which the read request detected in step 205 is directed. The system can determine, from the amount of data to be received, the number of pulses expected on the strobe signal.

In step 220, the system can synchronize a reference signal with the strobe signal. The reference signal can be both phase and frequency aligned with the strobe signal. In step 225, the system can count the pulses received or detected on the strobe signal. In step 230, the system can determine whether the last pulse has been detected based upon the expected number of pulses as determined in step 215. When the last pulse is detected, method 200 can proceed to step 235. When the last pulse is not detected, e.g., the pulse count has not reached the expected number of pulses, method 200 can loop back to step 225 to continue counting pulses.

In step 235, the system can determine whether the detected read request is one of a plurality of back-to-back read requests. For example, the system can monitor for further read requests that occur prior to the expiration of, or within, a predetermined amount of time of the prior read request so as to ensure a continuous stream of pulses on the strobe signal from the source synchronous device. When the system determines that the read request is one of a plurality of read requests with at least one additional read request to follow, method 200 can loop back to step 205 to continue processing. Since a further read request is detected, method 200 continues to step 210.

When the system determines that the read request is not one of a plurality of back-to-back read requests and that no further read request is expected or has been detected within the predetermined amount of time, method 200 proceeds to step 240. In step 240, the system can pass the reference signal in lieu of the strobe signal. After step 240, method 200 can loop back to step 205 to continue monitoring for a further read request. The reference signal can be passed until such time that a further read request is detected. Responsive to detecting a further read request, method 200 can continue processing and again pass the strobe signal. As noted, however, in one or more other embodiments, the system can pass the reference signal for only a predetermined amount of time or pass a predetermined number of pulses prior to switching back to passing the strobe signal.

Figure 3:
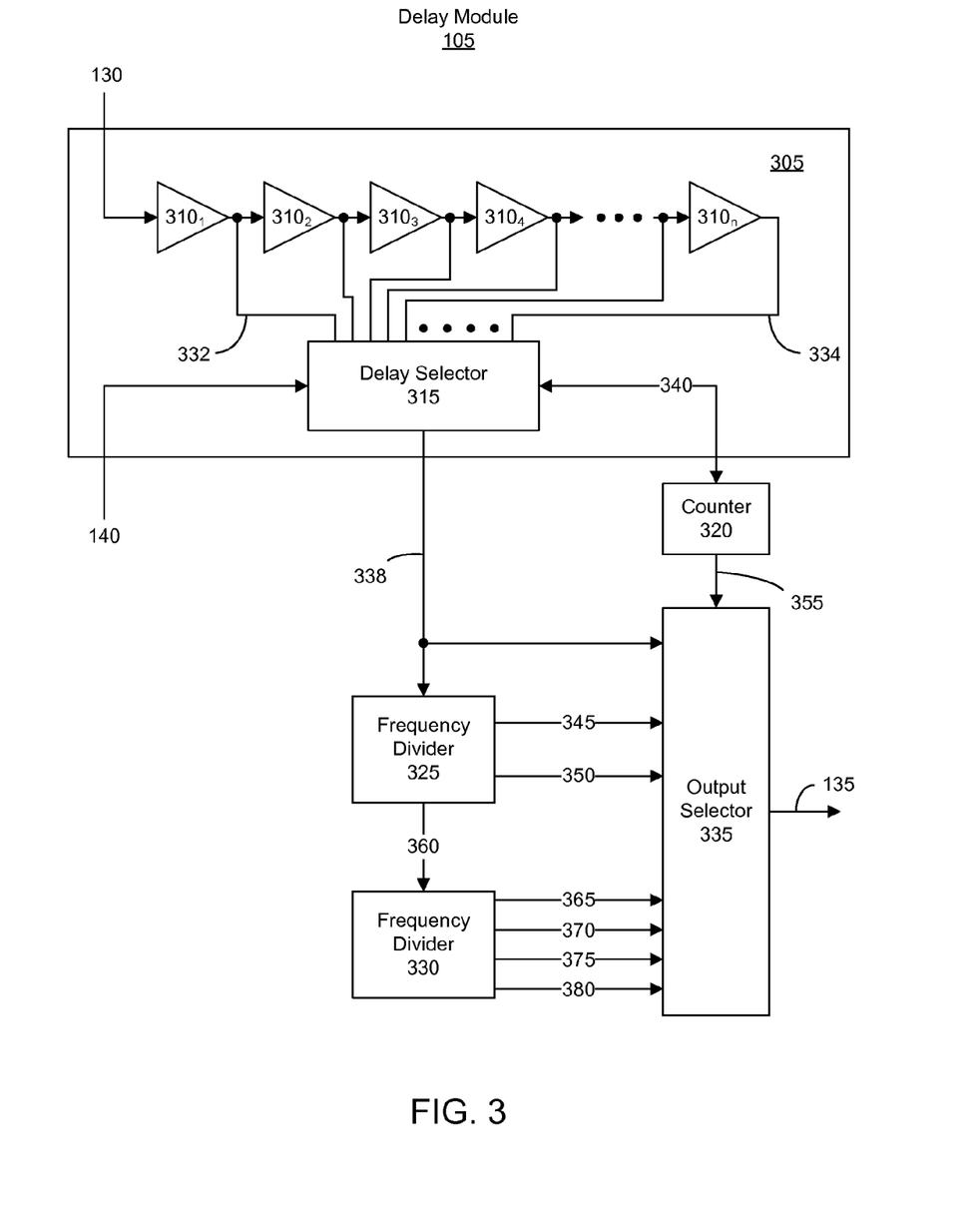
FIG. 3 is a second block diagram illustrating a system for delaying signals in accordance with another embodiment of the present invention.

FIG. 3 is a second block diagram illustrating a system for delaying signals in accordance with another embodiment of the present invention. More particularly, FIG. 3 illustrates an exemplary implementation of delay module 105 described with reference to FIG. 1. FIG. 3 illustrates an embodiment of delay module 105 in which reference signal 130 is set to a frequency that is higher than the frequency, e.g., a multiple of, the strobe signal. For example, the frequency of reference signal 130 can be one, two, three, four, etc., times the frequency of the strobe signal. In that case, a delay line can be used in combination with one or more frequency dividers as shown in FIG. 3. The frequency dividers facilitate generation of signal 135 at approximately the same frequency as the strobe signal.

It should be appreciated, however, that in one or more other embodiments, reference signal 130 and the strobe signal can have approximately a same frequency. When reference signal 130 and the strobe signal have approximately a same frequency, frequency dividers are not needed. Rather, a delay line can be used to supply the entirety of the amount of delay needed to achieve phase alignment between signal 135 and the strobe signal.

Continuing with FIG. 3, delay module 105 can include a delay line 305, a counter 320, one or more frequency dividers 325 and 330, and an output selector 335. Delay line 305 can be implemented as a multi-tap delay line configured to provide a variable amount of delay to reference signal 130. As shown, delay line 305 can include a plurality of delay elements $310_1$-$310_n$. Each of delay elements $310_1$-$310_n$ can provide a predetermined and/or approximately equivalent amount of delay. An output, also referred to as a tap, of each of delay elements $310_1$-$310_n$ can be coupled via a wire to delay selector 315.

Delay selector 315 can include circuitry that passes a particular tap, as specified by control signal 140, through as signal 338. In this manner, by selecting the particular delay element 310 from which the output of delay line 305 is taken, the amount of delay applied to reference signal 130 can be adjusted dynamically. Like numbers will be used to refer to the same items throughout this specification. Thus, as described with reference to FIG. 1, the phase detector can generate signal 140 for controlling delay selector 315 and, thus, the amount of delay applied to reference signal 130 by delay line 305.

For example, delay line 305 can include 64 taps, e.g., 64 different delay elements 310. Each of delay elements $310_1$-$310_n$ can be configured to provide an amount of delay approximately equal to the period of reference signal 130 divided by "n," where "n" is the total number of delay elements 310. Control signal 140, for example, can be configured to provide two different control signals including an increment signal and a decrement signal. Assertion of the increment signal as determined by the phase detector (not shown), adds a delay element 310 in the signal path of reference signal 130. Adding a delay element 310 also can be referred to as "increasing the delay by one tap." Assertion of the decrement signal as determined by the phase detector, removes a delay element 310 from the signal path of reference signal 130. Removing a delay element 310 also can be referred to as "decreasing the delay by one tap." The increment and decrement signals effectively select a particular tap that is passed by delay selector 315.

When the left-most signal, i.e., signal 332, is passed through delay selector 315 as signal 338, only a single delay element 310 is placed in the signal path of reference signal 130, thereby applying a minimum amount of delay available from delay line 305. The minimum amount of delay available from delay line 305 is approximately the period of reference signal 130 divided by the number of delay elements 310, i.e., "n." When the right-most signal, i.e., signal 334, is passed as signal 335, a maximum amount of delay available from delay line 305 is applied to reference signal 130. The maximum amount of delay available from delay line 305 is approximately a full period of reference signal 130.

In one or more embodiments, delay selector 315 can be configured to rollover in the forward and in the reverse directions. For example, when the maximum amount of delay available within delay line 305 is applied and control signal 140 indicates that the amount of delay is to be incremented, delay selector 315 rolls over from passing signal 334 to passing signal 332 corresponding to the minimum amount of delay available from delay line 305. Increasing the amount of delay applied to reference signal 130 when delay line 305 is already providing the maximum amount of delay can be referred to as a "forward rollover."

Similarly, when the minimum amount of delay available from delay line 305 is applied and control signal 140 indicates that the amount of delay is to be decremented, delay selector 315 rolls over from passing signal 332 to passing signal 334 corresponding to the maximum amount of delay available from delay line 305. Reducing the amount of delay applied to reference signal 130 when delay line 305 is already providing the minimum amount of delay can be referred to as a "reverse rollover."

Counter 320 is coupled to delay selector 315 via signal 340. Counter 320 can increment the value of the count stored therein when a delay element 310 is added to the signal path of reference signal 130. Counter 320 can decrement the value of the count stored therein when a delay element 310 is removed from the signal path of reference signal 130. In one or more embodiments, counter 320 can be configured to count up to "n," or from zero to "n−1," corresponding to the number of delay elements 310 within delay line 305. Accordingly, counter 320 can rollover in both the forward and reverse directions. Incrementing the counter beyond the highest value, e.g., "n," can cause a forward rollover where counter 320 rolls over, or resets, and continues to count up. Decrementing counter 320 when at zero, for example, can cause a reverse rollover where counter 320 rolls over in the reverse direction to the maximum count value and continues to count down. In any case, counter 320 can notify output selector 335 of a rollover, whether forward or reverse, and cause a different one of either signals 345 or 350 or 365, 370, 375, or 380 to be output as a result, i.e., signal 135.

Frequency divider 325 can be configured to divide the frequency of signal 338, e.g., the delayed version of reference signal 130, by two. As pictured, frequency divider 325 can generate signals 345 and 350 as output from received signal 338. Each of signals 345 and 350 can have a frequency of approximately one-half of the frequency of signal 338. Signal 345 can be phase aligned with signal 338, whereas signal 350 can be an inverted version of signal 345, i.e., 180 degrees out of phase.

In general, output selector 335 can be configured to operate in one of a plurality of modes. In a first mode, output selector 335 can be configured to output signal 338. The first mode of operation corresponds to one in which frequency division is not needed and signal 135 has a same frequency as that of the strobe signal. In a second mode, output selector 335 can be configured to output either signal 345 or signal 350 in response to control signal 355 from counter 320. The second mode can be used when reference signal 130 is approximately twice the frequency of the strobe signal. In a third mode, output selector 335 can be configured to pass either signal 365, 370, 375, or 380 responsive to control signal 355. The third mode can be used when reference signal 130 is approximately four times the frequency of the strobe signal.

Output selector 335 can be placed in the first mode, the second mode, or the third mode using any of a variety of techniques. For example, a control signal (not shown) can be provided to output selector 335 that places output selector 335 in either the first, second, or third mode. In another example, when the IC within which the system is disposed is a programmable IC, configuration data loaded into the programmable IC can specify the particular mode into which output selector 335 is to be placed.

As noted, delay line 305 can provide a full period of delay to reference signal 130. Turning to the case in which reference signal 130 has a frequency of approximately twice the strobe signal, it can be seen that delay line 305 provides only one-half of a period of delay to either of signals 345 and 350 since each of signals 345 and 350 has a frequency of approximately one-half of reference signal 130 and, therefore, twice the period. In order to achieve the remaining half period of delay that can be required for phase alignment of signal 135 with the strobe signal, e.g., when one of signals 345 or 350 is passed through output selector 335 as signal 135, counter 320 can be configured to instruct output selector 335 to pass signal 345 or signal 350 based upon whether the delay line rolls over.

In illustration, consider the case in which delay line 305 is applying a maximum amount of delay to reference signal 130 with delay selector 315 passing signal 334 as signal 338. Output selector 335 can be configured to initially pass signal 345 as signal 135. Thus, signal 338 is a version of reference signal 130 that is delayed by the maximum amount of delay available from delay line 305, i.e., one half of the period of either of signals 345 or 350. Signal 338 is frequency divided and can be output as signal 345, which can be passed through output selector 335 as signal 135. When control signal 140 instructs delay selector 315 to increment the amount of delay by adding a delay element 310, delay line 305 rolls over in the forward direction to provide the minimum amount of delay, e.g., passing signal 332 as signal 338. Counter 320 also rolls over in a forward direction and provides a notification of the forward rollover to output selector 335.

Responsive to an instruction from counter 320 via signal 355 indicating the forward rollover, output selector 335 passes signal 350 instead of signal 345. Recall that signal 350 is an inverted version of signal 345 and, therefore, is 180 degrees out of phase with signal 345. Thus, the amount of delay provided to signal 135, simply by passing signal 350 instead of 345, is approximately 180 degrees, e.g., one half of the period of reference signal 130. The rollover condition in delay line 305 causes the delay line to transition from providing the maximum amount of delay to providing the minimum amount of delay available.

The net delay applied in consequence of the forward rollover in delay line 305 and passing signal 350 instead of signal 345 results in a net increase in the delay of signal 135 of one tap, i.e., one delay element. Further increments per control signal 140 can be performed by again adding delay elements 310 to the signal path of reference signal 130. In this manner, up to a full period of delay (referring to signals 345 and 350) can be achieved despite delay line 305 providing only one-half of the delay needed.

A similar procedure can be performed in the opposite direction, e.g., when less delay is needed. For example, consider the case in which delay line 305 is applying a minimum amount of delay to reference signal 130 with delay selector 315 passing signal 332 as signal 338. Output selector 335 can be configured to initially pass signal 350 as signal 135. Thus, signal 338 is a version of reference signal 130 that is delayed by the minimum amount of delay available from delay line 305, i.e., one delay element 310. Signal 338 is frequency divided and can be output as signal 350, which can be passed through output selector 335 as signal 135. When control signal 140 instructs delay selector 315 to decrement the amount of delay by removing a delay element 310, delay line 305 rolls over in the reverse direction to provide the maximum amount of delay, e.g., passing signal 334 as signal 338. Counter 320 also rolls over in a reverse direction and provides a notification of the reverse rollover to output selector 335.

Responsive to an instruction from counter 320 via signal 355 indicating the reverse rollover, output selector 335 passes signal 345 instead of signal 350. Recall that signal 345 is an inverted version of signal 350 and, therefore, is 180 degrees out of phase with signal 350. Thus, the amount of delay provided to signal 135, simply by passing signal 345 instead of 350, is approximately 180 degrees, e.g., one half of the period of reference signal 130. The reverse rollover condition in delay line 305 causes the delay line to transition from providing the minimum amount of delay to providing the maximum amount of delay available.

The net delay applied in consequence of the reverse rollover in delay line 305 and passing signal 345 instead of signal 350 results in a net reduction in the delay of signal 135 of one tap, i.e., one delay element. Further reductions per control signal 140 can be performed by again removing delay elements 310 from the signal path of reference signal 130.

The combination of delay line 305 with frequency divider 325 illustrates one way in which delays greater than that available solely through delay line 305 can be achieved when a reference frequency that is higher than the frequency of the strobe signal is used. Through the addition of frequency divider 330, even greater flexibility can be attained.

Frequency divider 330 can receive an output signal 360 from frequency divider 325. Signal 360 has a frequency of approximately one-half of the frequency of reference signal 130. Accordingly, frequency divider 330 generates signals 365-380, each having a frequency of approximately one-fourth of the frequency of reference signal 130. In one or more embodiments, signal 365 can have a phase substantially equal to that of signal 360. Each of signals 365-380 can have a phase variance of approximately 90 degrees with respect to one another. For example, the phase of signal 370 can be approximately 90 degrees ahead of the phase of signal 365. The phase of signal 375 can be approximately 90 degrees ahead of the phase of signal 370. The phase of signal 380 can be approximately 90 degrees ahead of the phase of signal 375.

Output selector 335 can be configured to output, e.g., pass, one of signals 365-380 as signal 135 depending upon when counter 320 rolls over and the direction of the rollover, i.e., forward or reverse. With each of signals 365-380 having a frequency of approximately one-fourth of the frequency of reference signal 130, it can be appreciated that delay line 305 provides at most, one-fourth of the period of signals 365-380 in terms of delay. Thus, counter 320 can be used to determine whether delay selector 315 crosses quarter period boundaries, e.g., moves from passing signal 332 to 334 or from passing 334 to signal 332.

In illustration, a transition from passing signal 334 to signal 332, i.e., a forward rollover, causes counter 320 to instruct output selector 335 to pass a signal having a phase variance 90 degrees ahead of the current signal being passed. For example, when signal 365 is passed when a forward rollover occurs, output selector 335 passes signal 370 in lieu of signal 365. Likewise, a transition from passing signal 332 to signal 334, i.e., a reverse rollover, causes counter 320 to instruct output selector 335 to pass a signal having a phase variance 90 degrees behind the current signal being passed. For example, if signal 370 is passed when a reverse rollover occurs, output selector 335 passes signal 365 in lieu of signal 370. By selecting one of signals 365-380 combined with varying amounts of delay applied by delay line 305, signal 135 can have an adjustable delay ranging from approximately the delay provided by a single delay element 310 to an amount of delay that is approximately four times the period of reference signal 130, i.e., one full period of a signal such as signal 365.

Figure 4:
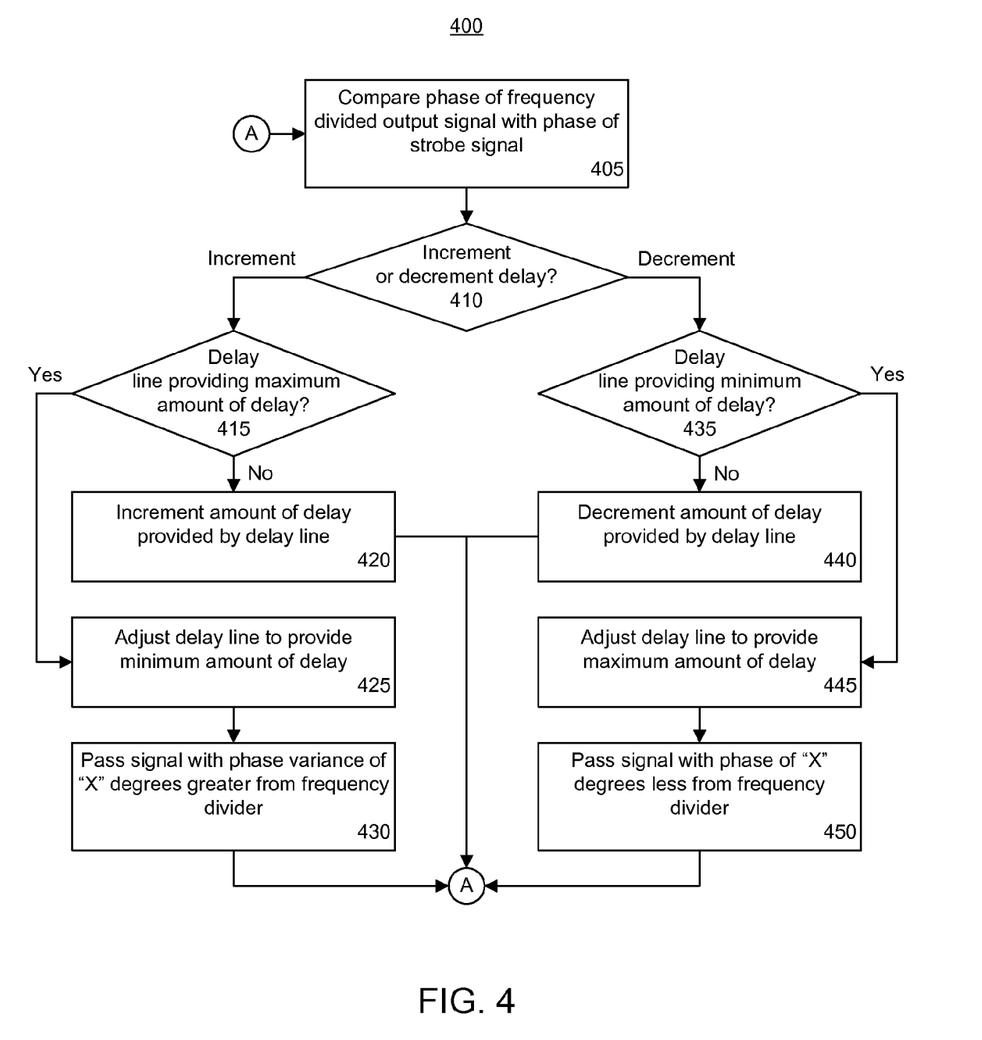
FIG. 4 is a second flow chart illustrating a method of synchronizing a reference signal with a strobe signal in accordance with another embodiment of the present invention.

FIG. 4 is a second flow chart illustrating a method 400 of synchronizing a reference signal with a strobe signal in accordance with another embodiment of the present invention. Method 400 can be performed by the system described with reference to FIGS. 1-3 of this specification. For purposes of illustration, method 400 is described with a reference signal that has a frequency of approximately four times the frequency of the strobe signal with which the reference signal output from the delay module is being phase aligned. Accordingly, the delay line can be coupled to a first frequency divider coupled to a second frequency divider providing the necessary frequency scaling down to that of the strobe signal.

In step 405, the system can compare the phase of the frequency divided output signal passed by the output selector with the phase of the strobe signal. In general, the phase detector can determine the phase relationship of the two signals. For example, the phase detector can determine whether the frequency divided output signal has a phase that is ahead or behind the phase of the strobe signal through edge detection.

In step 410, the system can determine whether to increment or decrement the amount of delay provided by the delay module. When the frequency divided signal is ahead of the strobe signal, the phase detector issues an increment instruction to the delay selector to increase the amount of delay provided by the delay module. Accordingly, method 400 can proceed to step 415. When the frequency divided signal is behind, e.g., lags, the strobe signal, the phase detector issues a decrement instruction to the delay selector to decrease the amount of delay provided by the delay module. In that case, method 400 can proceed to step 435.

In step 415, the system determines whether the delay line is providing the maximum amount of delay. For example, when the delay line is providing the maximum amount of delay, incrementing the amount of delay will cause a forward rollover in the delay line and in the counter. When this condition is detected, method 400 can proceed to step 425. When the delay line is not providing the maximum amount of delay, method 400 can proceed to step 420. In step 420, the amount of delay provided by the delay line can be incremented. After step 420, method 400 can loop back to step 405 to continue operating.

Continuing with step 425, when the delay line is providing the maximum amount of delay and is incremented, the forward rollover condition causes the delay line to transition to providing the minimum amount of delay. In step 430, the forward rollover condition causes the counter to instruct the output selector to pass a signal from the frequency divider having a phase of "X" degrees ahead of the signal currently being passed.

In the case where the signal being output has a frequency of approximately one-half of the frequency of the reference signal, the value of "X" can be approximately 180 degrees since the delay line provides a maximum amount of delay that is approximately one-half the period of the resulting output signal. As described, the first frequency divider can output two different signals, each having a 180 degree phase offset from the other. In the case where the signal being output has a frequency of approximately one-fourth of the frequency of the reference signal, the value of "X" can be approximately 90 degrees since the delay line provides a maximum amount of delay that is approximately one-fourth the period of the resulting output signal. As described, the second frequency divider can output four different signals, each having a 90 degree phase offset from the other.

The combination of passing a signal having a phase that is "X" degrees ahead of the current signal being passed and adjusting the delay line to provide the minimum delay results in an increment of the overall delay, e.g., a net delay, to the signal output from the delay module of adding a single tap or delay element.

In step 435, the system determines whether the delay line is providing the minimum amount of delay. For example, when the delay line is providing the minimum amount of delay, decrementing the amount of delay will cause a reverse rollover condition in the delay line and in the counter. When a reverse rollover condition is detected, method 400 can proceed to step 445. When the delay line is not providing the minimum amount of delay, the method can proceed to step 440. In step 440, the amount of delay provided by the delay line can be decremented. After step 440, method 400 can loop back to step 405 to continue operating.

Continuing with step 445, when the delay line is providing the minimum amount of delay and is decremented, the reverse rollover condition causes the delay line to transition to providing the maximum amount of delay. In step 450, the rollover condition causes the counter to instruct the output selector to pass a signal from the frequency divider having a phase of "X" degrees behind the signal currently being passed. The combination of passing a signal having a phase that is "X" degrees behind, e.g., lagging, the current signal being passed and adjusting the delay line to provide maximum delay results in a decrement of the overall delay to the signal output from the delay module of a single tap or delay element.

The one or more embodiments disclosed within this specification provide methods and systems relating to strobe signal management. By properly managing the strobe signal, additional pulses that are phase and frequency aligned with the strobe signal can be provided to aid in clocking data received from a source, and accompanying the strobe signal, into a particular destination in the IC in communication with the source. In addition, by utilizing a reference signal that has a frequency higher than the strobe signal, a delay module can be implemented that is capable of providing delay beyond the capability of the delay line through the use of one or more frequency divider circuits.

The flowcharts in the figures illustrate the architecture, functionality, and operation of possible implementations of systems, methods and computer program products according to various embodiments of the present invention. In this regard, each block in the flowcharts may represent a module, segment, or portion of code, which comprises one or more portions of executable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustrations, and combinations of blocks in the flowchart illustrations, can be implemented by special purpose hardware-based systems that perform the specified functions or acts, or combinations of special purpose hardware and executable instructions.

One or more embodiments of the present invention can be realized in hardware or a combination of hardware and software. The embodiments can be realized in a centralized fashion in one system or in a distributed fashion where different elements are spread across several interconnected systems. Any kind of data processing system or other apparatus adapted for carrying out at least a portion of the methods described herein is suited.

One or more embodiments of the present invention further can be embedded in a device such as a computer program product, which comprises all the features enabling the implementation of the methods described herein. The device can include a data storage medium, e.g., a computer-usable or computer-readable medium, storing program code that, when loaded and executed in a system comprising memory and a processor, causes the system to perform at least a portion of the functions described herein. Examples of data storage media can include, but are not limited to, optical media, magnetic media, magneto-optical media, computer memory such as random access memory or hard disk(s), or the like.

The terms "computer program," "software," "application," "computer-usable program code," "program code," "executable code," variants and/or combinations thereof, in the present context, mean any expression, in any language, code or notation, of a set of instructions intended to cause a system having an information processing capability to perform a particular function either directly or after either or both of the following: a) conversion to another language, code, or notation; b) reproduction in a different material form. For example, program code can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, whether directly without any intervening elements or indirectly with one or more intervening elements, unless otherwise indicated. Two elements also can be coupled mechanically, electrically, or communicatively linked through a communication channel, pathway, network, or system.

One or more embodiments disclosed herein can be embodied in other forms without departing from the spirit or essential attributes thereof. Accordingly, reference should be made to the following claims, rather than to the foregoing specification, as indicating the scope of the embodiments of the present invention.

What is claimed is:

1. A method of communicating with a source synchronous device, the method comprising:
   determining an expected number of pulses of a strobe signal to be received in response to a first read request directed to the source synchronous device;
   receiving the strobe signal from the source synchronous device;
   counting pulses in the strobe signal; and
   responsive to detecting a last pulse of the expected number of pulses of the strobe signal, replacing the strobe signal with a reference signal that is phase and frequency aligned with the strobe signal.

2. The method of claim 1, further comprising:
   continuing to replace the strobe signal with the reference signal for a predetermined number of pulses of the reference signal; and
   responsive to providing the predetermined number of pulses of the reference signal, replacing the reference signal with the strobe signal.

3. The method of claim 1, further comprising:
   continuing to replace the strobe signal with the reference signal while monitoring for a second read request; and
   responsive to detecting a second read request, replacing the reference signal with the strobe signal.

4. The method of claim 1, further comprising:
   sending the first read request to the source synchronous device.

5. The method of claim 1, further comprising:
   responsive to the first read request, phase aligning the strobe signal with the reference signal.

6. The method of claim 1, further comprising:
   determining whether the first read request is part of a plurality of back-to-back read requests; and
   only replacing the strobe signal with the reference signal when the first read request is either not part of the plurality of back-to-back read requests or is a last one of a plurality of back-to-back read requests.

7. The method of claim 1, further comprising:
   determining whether a second read request is detected within a predetermined amount of time of the first read request; and
   only replacing the strobe signal with the reference signal when no second read request is detected within the predetermined amount of time.

8. A system for communicating with a source synchronous device, the system comprising:
   a pulse controller configured to count pulses from the source synchronous device received in a strobe signal responsive to a first read request, wherein the pulse controller is configured to detect a last pulse of a predetermined number of expected pulses; and
   a multiplexer coupled to the pulse controller and configured to selectively pass a strobe signal or a reference signal responsive to an instruction received from the pulse controller, wherein the reference signal is phase and frequency aligned with the strobe signal;
   wherein responsive to the pulse controller detecting the last pulse, the pulse controller is configured to instruct the multiplexer to pass the reference signal in lieu of the strobe signal.

9. The system of claim 8, wherein the pulse controller is further configured to count pulses in the reference signal and, responsive to passing a predetermined number of pulses in the reference signal, instruct the multiplexer to pass the strobe signal in lieu of the reference signal.

10. The system of claim 8, wherein the pulse controller is further configured to pass the reference signal in lieu of the strobe signal until detecting a second read request and, responsive to detecting the second read request, instruct the multiplexer to pass the strobe signal in lieu of the reference signal.

11. The system of claim 8, wherein the pulse controller is further configured to determine whether the read request is part of a plurality of back-to-back read requests and, only instruct the multiplexer to pass the reference signal in lieu of the strobe signal when either the read request is not part of the plurality of back-to-back read requests or is a last one of a plurality of back-to-back read requests.

12. The system of claim 8, wherein the pulse controller is further configured to determine whether a second read request is detected within a predetermined amount of time of the first read request and only replace the strobe signal with the reference signal when no second read request is detected within the predetermined amount of time.

* * * * *